United States Patent [19]
Smith et al.

[11] Patent Number: 5,231,361
[45] Date of Patent: Jul. 27, 1993

[54] VOLTAGE CONTROLLED PUSH-PUSH OSCILLATOR WITH PARALLEL RESONANT TANK CIRCUITS

[75] Inventors: Duncan Murray Smith; Barry Ross Allen, both of Redondo Beach, Calif.

[73] Assignee: TRW Inc., Redondo Beach, Calif.

[21] Appl. No.: 474,909

[22] Filed: Feb. 5, 1990

[51] Int. Cl.$^5$ .......................... H03B 5/12; H03B 5/18
[52] U.S. Cl. ...................................... 331/56; 331/100; 331/117 R; 331/117 D; 331/177 V
[58] Field of Search .............. 331/56, 96, 100, 117 R, 331/117 FE, 117 D, 167, 168, 177 V

[56] References Cited

U.S. PATENT DOCUMENTS

| | | | |
|---|---|---|---|
| 3,939,429 | 2/1976 | Löhn et al. | 325/432 |
| 4,360,790 | 11/1982 | Heise | 331/114 |
| 4,485,355 | 11/1984 | Scott | 331/117 FE |
| 4,527,130 | 7/1985 | Lütteke | 331/36 C |
| 4,633,197 | 12/1986 | Vanderspool, II | 332/16 T |
| 4,706,045 | 11/1987 | Ouyang et al. | 331/117 FE |
| 4,754,236 | 6/1988 | Mamodaly et al. | 331/117 FE |
| 4,763,084 | 8/1988 | Pavio, Jr. et al. | 331/56 |
| 4,797,638 | 1/1989 | Usui et al. | 331/117 D |
| 4,810,976 | 3/1989 | Cowley et al. | 331/117 R |

*Primary Examiner*—Siegfried H. Grimm
*Attorney, Agent, or Firm*—James M. Steinberger; Ronald L. Taylor

[57] ABSTRACT

The present invention resides in a push-push voltage controlled oscillator (VCO) utilizing parallel LC resonant tank circuits for improved phase noise characteristics. The push-push VCO of the present invention includes two voltage controlled oscillators connected in parallel and in phase opposition, with each oscillator including a transistor connected in series with the parallel LC resonant tank circuit. The oscillators operate at the same resonant frequency $f_0$, but are 180 degrees out of phase. Therefore, the fundamental and odd harmonics of the resonant frequency $f_0$ cancel each other out and the even harmonics add together to produce an output signal at twice the resonant frequency $f_0$.

14 Claims, 1 Drawing Sheet

VOLTAGE CONTROLLED PUSH-PUSH OSCILLATOR WITH PARALLEL RESONANT TANK CIRCUITS

BACKGROUND OF THE INVENTION

This invention relates generally to voltage controlled oscillators and, more particularly, to push-push voltage controlled oscillators which operate in the microwave frequency spectrum.

Voltage controlled oscillators (VCO's) are utilized in a wide variety of electronic devices, for example, for voltage-to-frequency conversion and for RF signal generation. A voltage controlled oscillator generates a sinusoidal output signal which varies in frequency as a function of an input control voltage. One common type of voltage controlled oscillator includes an active feedback element, such as a transistor, and a frequency-determining element, such as a resonant tank circuit. The transistor provides positive feedback to the tank circuit, causing the tank circuit to oscillate at a resonant frequency $f_0$ The resonant tank circuit typically includes a variable-capacitance element, such as a varactor diode, which allows the resonant frequency of the tank circuit to be easily varied by the input control voltage.

In many applications, such as in broadband receivers for microwave communications systems, microwave signals must be generated over a wide frequency range with low phase or side band noise. One type of broadband voltage controlled oscillator which generates an output signal with low phase noise is a frequency-doubling or push-push voltage controlled oscillator. A push-push VCO includes two identical voltage controlled oscillators connected in parallel and in phase opposition. The output signal of each oscillator contains fundamental and higher order harmonics of the oscillator's resonant frequency $f_0$, but because the two oscillators are 180 degrees out of phase, the fundamental and odd harmonics cancel each other out and the even harmonics add together to produce an output signal at twice the resonant frequency $f_0$. The output signal also includes the higher order even harmonics of the resonant frequency $f_0$, but these components are generally negligible.

A typical push-push voltage controlled oscillator of the prior art, described in U.S. Pat. No. 4,527,130 to Lütteke, U.S. Pat. No. 3,939,429 to Löhn et al. and U.S. Pat. No. 4,360,790 to Heise, utilizes series LC resonant tank circuits. Although this type of push-push voltage controlled oscillator provides good phase noise characteristics, there is still need for further improvement. The present invention is directed to this end.

SUMMARY OF THE INVENTION

The present invention resides in a push-push voltage controlled oscillator (VCO) utilizing parallel LC resonant tank circuits for improved phase noise characteristics. The push-push VCO of the present invention includes two voltage controlled oscillators connected in parallel and in phase opposition, with each oscillator including a transistor connected in series with the parallel LC resonant tank circuit. The oscillators operate at the same resonant frequency $f_0$, but are 180 degrees out of phase. Therefore, the fundamental and odd harmonics of the resonant frequency $f_0$ cancel each other out and the even harmonics add together to produce an output signal at twice the resonant frequency $f_0$.

The transistor in each oscillator is an npn bipolar transistor having its collector and emitter terminals shunted to ground to provide the necessary feedback to the tank circuit. A capacitive element in the emitter shunt path allows the feedback of the transistor to be adjusted. Arranged between the base terminals of the two transistors are the parallel LC resonant tank circuits. Each parallel L resonant tank circuit includes an inductive element shunted to ground and connected in parallel with a varactor diode. The resonant frequency $f_0$ of the tank circuit is easily varied by adjusting the capacitance of the varactor diode.

The push-push VCO of the present invention provides an output signal with reduced phase or side band noise when compared with the push-push VCO of the prior art because a parallel resonant tank circuit has a higher Q than a series resonant tank circuit. This is a result of the series resonant tank circuit acting as a bandpass filter, with the capacitive element filtering out the low frequencies and the inductive element filtering out the high frequencies. In contrast, a parallel resonant tank circuit acts as a high pass filter, which allows for more efficient coupling of the second harmonic of the resonant frequency to the output.

The parallel LC resonant tank circuit of the present invention not only provides a higher Q when compared with a series resonant tank circuit, but a parallel resonant tank circuit is more readily implemented as a high Q microwave device than a series resonant tank circuit. This is because a high Q parallel resonant tank circuit requires a large capacitance and a small inductance, which is readily implemented using microstrip transmission lines and varactor diodes, while a high Q series resonant tank circuit requires a large inductance and a small capacitance. In addition, a large varactor capacitance provides increased tuning range for improved wideband performance.

It will be appreciated from the foregoing that the present invention represents a significant advance in the field of voltage controlled oscillators. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Figure 1:
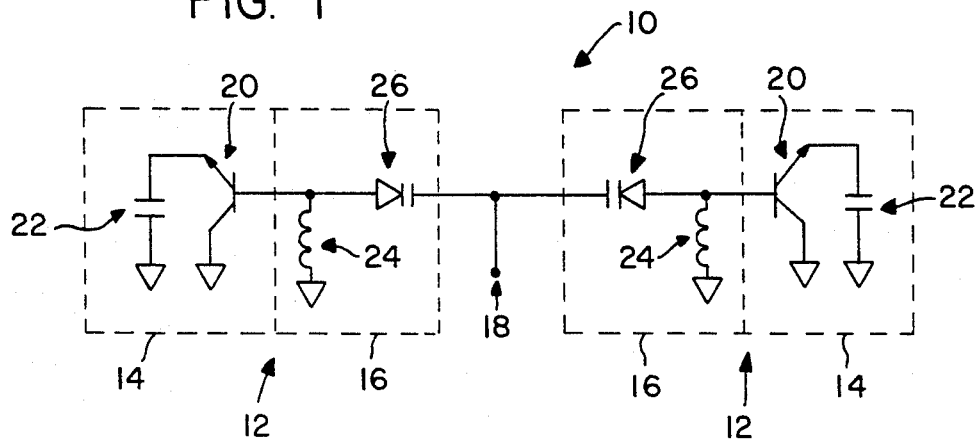
FIG. 1 is a simplified circuit diagram of the push-push voltage controlled oscillator of the present invention.

A simplified circuit diagram of a push-push voltage controlled oscillator (VCO) 10 in accordance with the present invention is illustrated in FIG. 1. The push-push VCO 10 includes two voltage controlled oscillator circuits 12 connected in parallel and in phase opposition. Each oscillator circuit 12 includes an active feedback element 14 connected in series with a parallel LC resonant tank circuit 16. The oscillator circuits 12 operate at the same resonant frequency $f_0$, but are 180 degrees out of phase. Therefore, the fundamental and odd harmonics of the resonant frequency $f_0$ cancel each other out and the even harmonics add together to produce an output signal at terminal 18 at twice the resonant frequency $f_0$.

As shown in FIG. 1, each active feedback element 14 includes an npn bipolar transistor 20 having its collector and emitter terminals shunted to ground to provide the necessary feedback to the tank circuit 16. A capacitive element 22 in the emitter shunt path allows the feedback of the transistor 20 to be adjusted. Arranged between the base terminals of the two transistors 20 are the parallel LC resonant tank circuits 16. Each parallel LC resonant tank circuit 16 includes an inductive element 24 shunted to ground and connected in parallel with a varactor diode 26. The resonant frequency $f_0$ of the tank circuit is readily varied by adjusting the capacitance of the varactor diode 26.

The push-push VCO 10 of the present invention provides an output signal at terminal 18 with reduced phase or side band noise when compared with the push-push VCO of the prior art. Phase noise is largely dependent on the Q of the frequency-determining element, the Q of a circuit being a measure of the circuits tendency to operate at frequencies near its resonant frequency $f_0$. Signals in a high Q circuit tend to oscillate at frequencies very close to the resonant frequency $f_0$, with the magnitudes of the higher order harmonics being generally negligible. Low Q circuits tend to produce higher order harmonics with significant magnitudes which are spread over a wider range of frequencies. Noise generated within a low Q circuit can therefore spread farther away from the resonant frequency $f_0$ and interfere with adjacent noise sensitive frequency bands.

The push-push VCO of the present invention provides an output signal with reduced phase or side band noise when compared with the push-push VCO of the prior art because a parallel resonant tank circuit has a higher Q than a series resonant tank circuit. This is a result of the series resonant tank circuit acting as a bandpass filter, with the capacitive element filtering out the low frequencies and the inductive element filtering out the high frequencies. In contrast, a parallel resonant tank circuit acts as a high pass filter, which allows for more efficient coupling of the second harmonic of the resonant frequency to the output.

Figure 2:
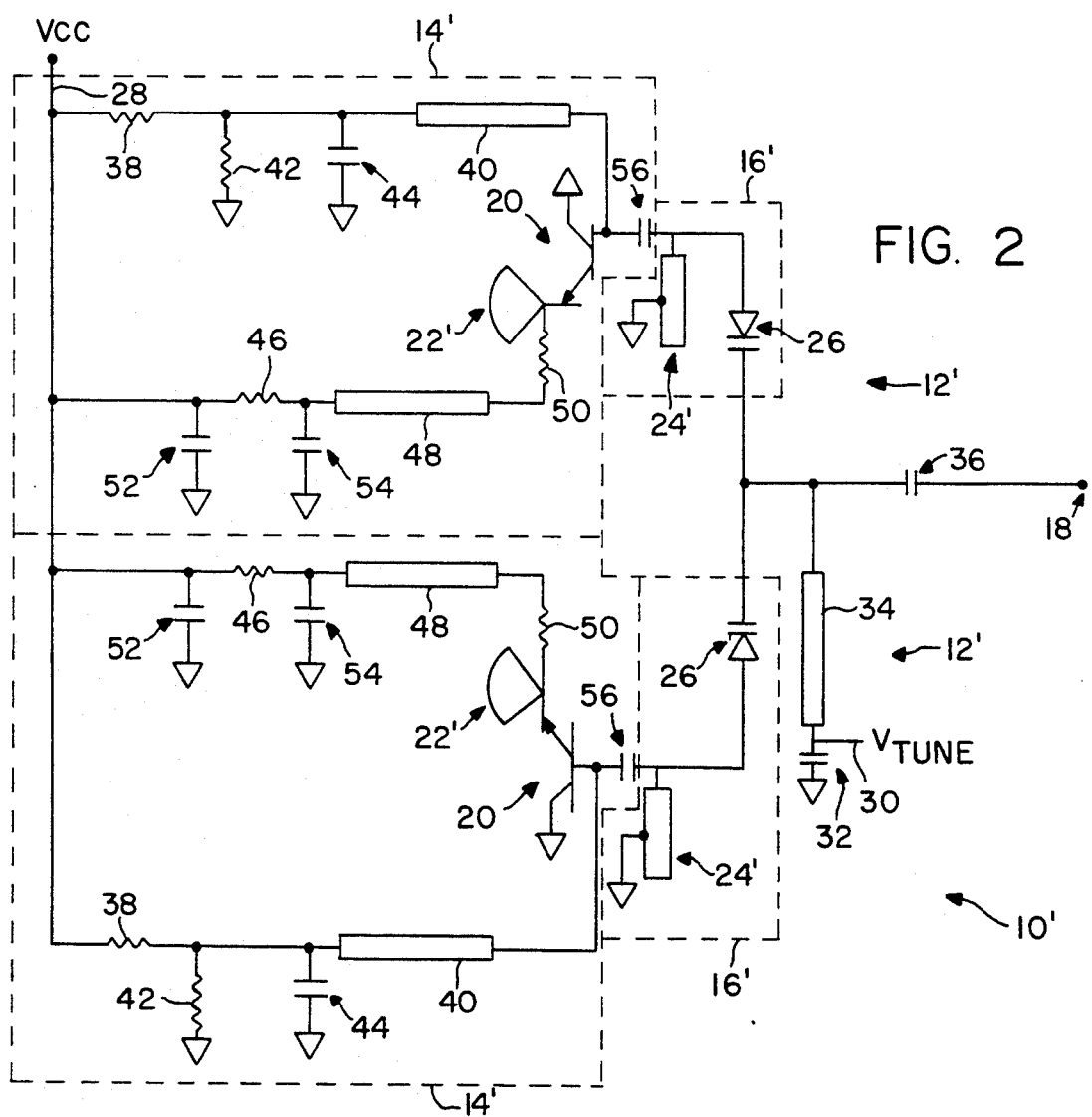
FIG. 2 is a detailed circuit diagram of the push-push voltage controlled oscillator of the present invention for operation in the microwave frequency spectrum.

FIG. 2 illustrates a detailed circuit diagram of a microwave push-push VCO 10' in accordance with the present invention. Each oscillator circuit 12' includes an active feedback element 14' connected in series with a parallel LC resonant tank circuit 16'. Each active feedback element 14, includes an npn bipolar transistor 20 having its collector terminal shunted to ground. A fan-shaped microwave stub 22' connected to the emitter terminal of the transistor 20 allows the feedback of the transistor to be readily adjusted. A supply voltage $V_{cc}$, on line 28, provides power to the transistor 20. Arranged between the base terminals of the two transistors 20 are the parallel LC resonant tank circuits 16'. Each parallel LC resonant tank circuit 16' includes a microstrip transmission line 24' connected in parallel with a varactor diode 26.

The microwave stubs 22' are implemented in a radial fan configuration and allow the capacitance on the emitter of each transistor 20 to be accurately tuned. The capacitance of a microwave stub 22' is adjusted by bonding additional pieces of the fan configuration to the microwave stub. The microstrip transmission lines 24' allow the inductance of each resonant tank circuit 16' to be accurately tuned by adjusting the grounding point of the microstrip transmission line. The inductance of the resonant tank circuit 16' is tuned in order to adjust the frequency band of the VCO 10', to adjust for manufacturing tolerances of the circuit elements and to allow for the use of a wide variety of varactor diodes 26.

The resonant frequency $f_0$ of each tank circuit 16' is actively adjusted by a voltage $V_{tune}$, on line 30, which adjusts the capacitance of each varactor diode 26. The tuning voltage is shunted to ground through a capacitor 32 and applied to the varactor diodes 26 through a microstrip transmission line 34. The DC tuning voltage is isolated from the AC output at terminal 18 by a capacitor 36.

The supply voltage $V_{cc}$ on line 28 is applied to the base terminal of each bipolar transistor 20 through a resistor 38 connected in series with a microstrip transmission line 40. The terminal between the resistor 38 and the microstrip transmission line 40 is shunted to ground through a resistor 42 connected in parallel with a capacitor 44. The supply voltage $V_{cc}$ on line 28 is applied to the emitter terminal of each bipolar transistor 20 through a series connection of a resistor 46, a microstrip transmission line 48, another resistor 50 and the microwave stub 22'. Both terminals of the resistor 46 are shunted to ground through capacitors 52, 54, respectively. The base terminal of each transistor 20 is connected to its respective resonant tank circuit 16' through a capacitor 56.

The parallel LC resonant tank circuit 16 of the present invention not only provides a higher Q when compared with a series resonant tank circuit, but a parallel resonant tank circuit is more readily implemented as a high Q microwave device than a series resonant tank circuit. This is because a high Q parallel resonant tank circuit requires a large capacitance and a small inductance, which is readily implemented using microstrip transmission lines and varactor diodes, while a high Q series resonant tank circuit requires a large inductance and a small capacitance. In addition, a large varactor capacitance provides increased tuning range for improved wideband performance.

From the foregoing, it will be appreciated that the present invention represents a significant advance in the field of voltage controlled oscillators. Although a preferred embodiment of the invention has been shown and described, it will be apparent that other adaptations and modifications can be made without departing from the spirit and scope of the invention. Accordingly, the invention is not to be limited, except as by the following claims.

We claim:

1. A push-push voltage controlled oscillator, comprising:
   two voltage controlled oscillators connected in parallel and in phase opposition, each oscillator including a parallel resonant tank circuit;
   wherein the resonant tank circuits oscillate at a resonant frequency with the odd harmonics of the resonant frequency cancelling each other out and the even harmonics adding together to produce an output signal at twice the resonant frequency with reduced phase noise.

2. The push-push voltage controlled oscillator as set forth in claim 1, wherein each resonant tank circuit includes a variable-capacitance element connected in parallel with an inductive element.

3. The push-push voltage controlled oscillator as set forth in claim 2, wherein the variable-capacitance element is a varactor diode.

4. The push-push voltage controlled oscillator as set forth in claim 2, wherein the inductive element is a microstrip transmission line.

5. The push-push voltage controlled oscillator as set forth in claim 1, and further including an active feedback element connected in series with each resonant tank circuit.

6. A push-push voltage controlled oscillator, comprising:
two voltage controlled oscillator means connected in parallel and in phase opposition, each oscillator means including separate parallel resonant tank means;
wherein the resonant tank means oscillate at a resonant frequency with the odd harmonics of the resonant frequency cancelling each other out and the even harmonics adding together to produce an output signal at twice the resonant frequency with reduced phase noise.

7. The push-push voltage controlled oscillator as set forth in claim 6, wherein each resonant tank means includes variable-capacitance means connected in parallel with inductive means.

8. The push-push voltage controlled oscillator as set forth in claim 7, wherein the variable-capacitance means is a varactor diode.

9. The push-push voltage controlled oscillator as set forth in claim 7, wherein the inductive means is a microstrip transmission line.

10. The push-push voltage controlled oscillator as set forth in claim 6, and further including active feedback means connected in series with each resonant tank means.

11. A push-push voltage controlled oscillator, comprising:
two voltage controlled oscillators connected in parallel and in phase opposition, each including a parallel resonant tank circuit connected in series with an active feedback element;
wherein the resonant tank circuits oscillate at a resonant frequency with the odd harmonics of the resonant frequency cancelling each other out and the even harmonics adding together to produce an output signal at twice the resonant frequency with reduced phase noise.

12. The push-push voltage controlled oscillator as set forth in claim 11, wherein each resonant tank circuit includes a variable-capacitance element connected in parallel with an inductive element.

13. The push-push voltage controlled oscillator as set forth in claim 12, wherein the variable-capacitance element is a varactor diode.

14. The push-push voltage controlled oscillator as set forth in claim 12, wherein the inductive element is a microstrip transmission line.

* * * * *